(12) United States Patent
Park et al.

(10) Patent No.: US 12,002,428 B2
(45) Date of Patent: Jun. 4, 2024

(54) GATE DRIVING CIRCUIT HAVING A NODE CONTROLLER AND DISPLAY DEVICE THEREOF

(71) Applicant: LG Display Co., Ltd., Seoul (KR)

(72) Inventors: Jae Sung Park, Paju-si (KR); Yong Ho Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/962,042

(22) Filed: Oct. 7, 2022

(65) Prior Publication Data

US 2023/0206851 A1 Jun. 29, 2023

(30) Foreign Application Priority Data

Dec. 29, 2021 (KR) ........................ 10-2021-0191874

(51) Int. Cl.
*G09G 3/3266* (2016.01)
*G09G 3/3275* (2016.01)

(52) U.S. Cl.
CPC ......... *G09G 3/3266* (2013.01); *G09G 3/3275* (2013.01); *G09G 2310/0278* (2013.01); *G09G 2310/0286* (2013.01)

(58) Field of Classification Search
CPC .................................................. G09G 3/3266
USPC .......................................................... 345/204
See application file for complete search history.

(56) References Cited

U.S. PATENT DOCUMENTS

| 2008/0253499 | A1* | 10/2008 | Chan | ...................... | G11C 19/28 327/333 |
| 2019/0043405 | A1* | 2/2019 | Noh | .......................... | G09G 3/20 |
| 2020/0243018 | A1* | 7/2020 | Kim | ..................... | G09G 3/3677 |

FOREIGN PATENT DOCUMENTS

| KR | 10-2019-0014842 A | 2/2019 |
| KR | 10-2020-0094895 A | 8/2020 |

* cited by examiner

*Primary Examiner* — Long D Pham
(74) *Attorney, Agent, or Firm* — Birch, Stewart, Kolasch & Birch, LLP

(57) ABSTRACT

A gate driving circuit that can be stably driven by improving output characteristics of a last output buffer unit, and a display device comprising the gate driving circuit, are discussed. The gate driving circuit can include a plurality of subordinately connected stages, where an Nth (N being a natural number) stage includes a node controller configured to control voltages of a first node and a second node according to a set signal and a reset signal. The Nth stage can further include a plurality of scan pulse output units configured to receive a plurality of scan clocks, and output each of the scan clocks as a scan pulse according to voltages of the first node and the second node.

16 Claims, 7 Drawing Sheets

GATE DRIVING CIRCUIT HAVING A NODE CONTROLLER AND DISPLAY DEVICE THEREOF

CROSS-REFERENCE TO RELATED APPLICATIONS

This application claims priority to Korean Patent Application No. 10-2021-0191874, filed in the Republic of Korea on Dec. 29, 2021, the entire contents of which are hereby expressly incorporated by reference into the present application.

BACKGROUND OF THE INVENTION

Field of the Invention

The present invention relates to a gate driving circuit for shifting a gate signal using a shift register and a display device comprising the same.

Discussion of the Related Art

In the information society, various technologies have been developed in the field of display devices for displaying visual information as an image or video. A driving circuit of a display device includes a data driving circuit for supplying a data signal to data lines, a gate driving circuit for sequentially supplying a gate signal (or a scan signal) to gate lines (or scan lines), etc. The gate driving circuit can be directly formed on a display area of the same substrate together with circuit elements of a pixel array included in a screen.

The circuit elements of the pixel array are included in a pixel circuit formed in each of pixels defined in a matrix by data lines and gate lines of the pixel array. Each of the circuit elements of the pixel array and the gate driving circuit includes a plurality of transistors. Hereinafter, the gate driving circuit directly formed on the display area of the display panel together with the circuit elements of the pixel array will be referred to as a "GIP circuit".

Most display devices each write data to pixels using a progressive scan method. In the progressive scan method, pixel data of an input image is sequentially written to all lines of a pixel array during a vertical active period of one frame period. For example, after simultaneously writing pixel data to pixels of a first line, pixel data is simultaneously written to pixels of a second line, and then pixel data is simultaneously written to pixels of a third line. In this way, pixel data is sequentially written to pixels of all lines of the display panel. In order to implement such a progressive scan method, the GIP circuit shifts an output signal using a shift register and sequentially supplies the gate signal to the gate lines. Here, the output signal can be interpreted as a gate signal or a scan signal.

The shift register includes a plurality of subordinately connected stages, and each stage has one output buffer that generates one gate signal and supplies the generated gate signal to one gate line.

In recent years, since the gate driving circuit (GIP circuit) is directly formed in the display area of the display panel together with the circuit elements of the pixel array, it has been required to minimize a configuration of the GIP circuit.

Accordingly, a shift register for outputting a plurality of gate signals in one stage has been developed. For example, one stage has a plurality of output buffers each for generating one gate signal, which is referred to as "NSDC".

As described above, since one stage includes a plurality of output buffers, there is a problem in that a voltage of a set node is lowered at the time of occurrence of output of a gate signal (scan signal) of a last output butter among a plurality of output butters, and thus a falling time (TF) of the gate signal (scan signal) of the last output butter is increased.

SUMMARY OF THE INVENTION

Accordingly, the present invention is directed to a gate driving circuit and a display device using the same that substantially obviate one or more problems due to limitations and disadvantages of the related art.

An object of the present invention is to provide a gate driving circuit that can be stably driven by improving output characteristics of a last output buffer unit and a display device comprising the same.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a gate driving circuit includes a plurality of subordinately connected stages, in which an Nth (n being a natural number) stage includes a node controller configured to control voltages of a first node and a second node according to a set signal and a reset signal, and a plurality of scan pulse output units configured to receive a plurality of scan clocks, and output each of the scan clocks as a scan pulse according to voltages of the first node and the second node, and a last scan pulse output unit among the plurality of scan pulse output units further outputs a corresponding scan clock as a scan pulse according to a first node voltage of an (N+1)th stage.

The Nth stage can further include a carry signal output unit configured to output a carry clock as a carry pulse signal according to voltages of the first node and the second node.

The last scan pulse output unit can include a first pull-up transistor turned on or turned off according to a voltage of the first node to output a corresponding scan clock to an output terminal, a second pull-up transistor turned on or turned off according to the first node voltage of the (N+1)th stage to output the corresponding scan clock to an output terminal, and a pull-down transistor turned on or turned off according to a voltage of the second node to output low-voltage power to an output terminal.

The last scan pulse output unit can further include a capacitor connected between a gate electrode of the first pull-up transistor and the output terminal to bootstrap the first node.

In another aspect of the present invention, a display device includes a display panel including data lines, gate lines, and subpixels, a data driving circuit configured to supply a data signal of an input image to the data lines, and a gate driving circuit configured to supply a gate signal to the gate lines, in which the gate driving circuit includes a plurality of subordinately connected stages, an Nth stage includes a node controller configured to control voltages of a first node and a second node according to a set signal and a reset signal, and a plurality of scan pulse output units configured to receive a plurality of scan clocks, and output each of the scan clocks as a scan pulse according to voltages of the first node and the second node, and a last scan pulse output unit between the plurality of scan pulse output units further outputs a corresponding scan clock as a scan pulse according to a first node voltage of an (N+1)th stage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
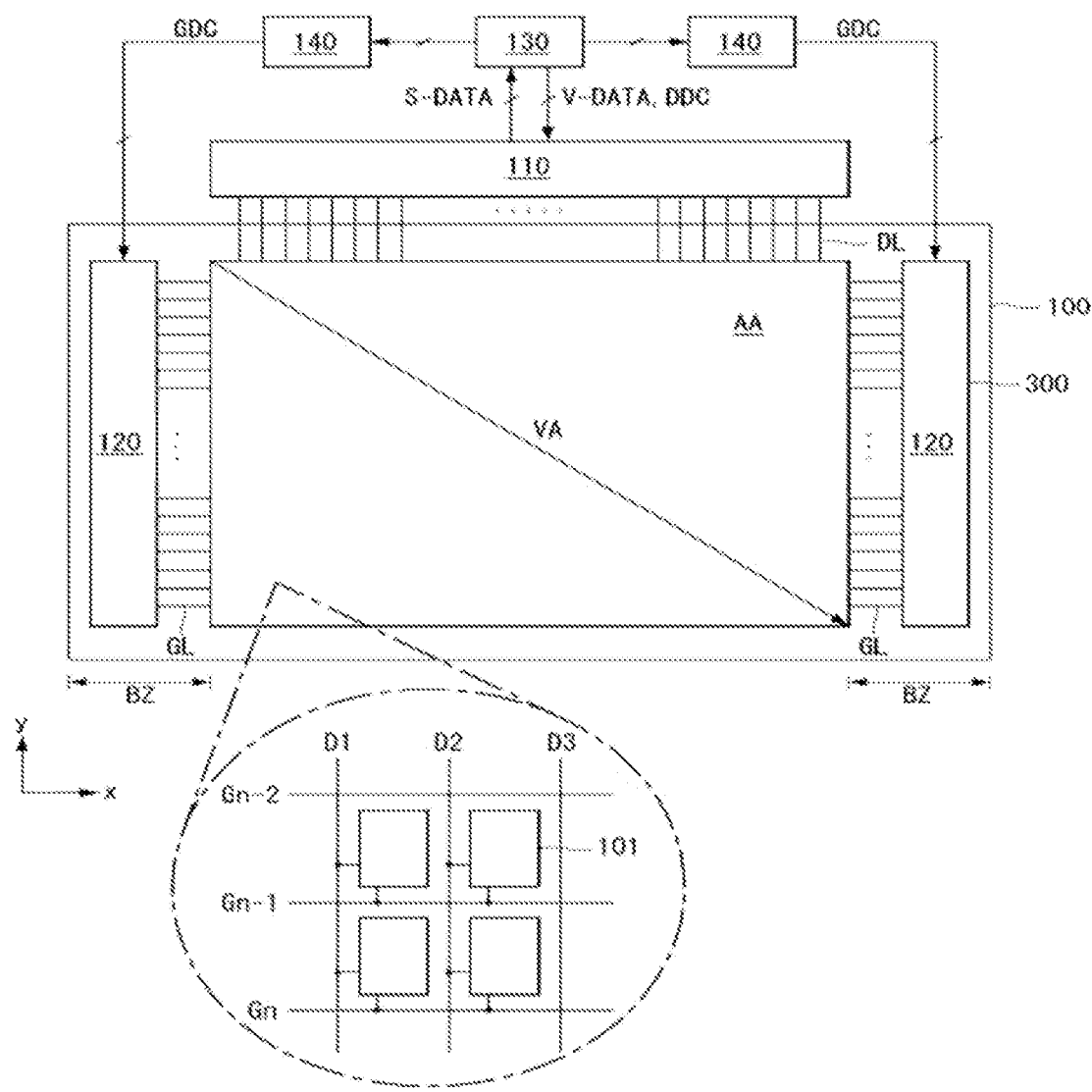
FIG. 1 is a configuration diagram of a display device according to an embodiment of the present invention.

The advantages and features of the present invention, and the method for achieving the advantages and features will become apparent with reference to embodiments described below in detail in conjunction with the accompanying drawings. However, the present invention is not limited to the embodiments disclosed below and can be implemented in a variety of different forms, and these embodiments allow the disclosure of the present invention to be complete and are merely provided to fully inform those of ordinary skill in the art to which the present invention belongs of the scope of the invention. Further, the invention is merely defined by the scope of the claims.

The shapes, sizes, proportions, angles, numbers, etc. disclosed in the drawings for describing the embodiments of the present invention are illustrative, and thus the present invention is not limited to the illustrated elements. The same reference symbol refers to the same element throughout the specification. In addition, in describing the present invention, when it is determined that a detailed description of a related known technology can unnecessarily obscure the subject matter of the present invention, such a detailed description will be omitted.

When "equipped with", "including", "having", "consisting", etc. are used in this specification, other parts can also be present, unless "only" is used. When an element is expressed in the singular, the element can be interpreted as being plural unless otherwise explicitly stated.

In interpreting an element, it is to be interpreted as including an error range even when there is no separate explicit description thereof.

In the case of a description of a positional relationship, for example, when a positional relationship between two parts is described using "on", "above", "below", "next to", etc., one or more other parts can be located between the two parts, unless "immediately" or "directly" is used.

Although "first", "second", etc. can be used to distinguish between elements, functions or structures of these elements are not limited by the ordinal numbers attached in front of the elements or names of the elements. Since the claims are described based on elements, the ordinal numbers attached in front of the names of the elements in the claims may not match the ordinal numbers attached in front of the names of the elements in the embodiments.

The following embodiments can be partially or wholly united or combined with each other, and various types of interlocking and driving are technically possible. The respective embodiments can be implemented independently of each other, or can be implemented together in an interrelated relationship.

In the embodiments of the present invention, each of a GIP circuit and a pixel circuit of a gate driving circuit includes a plurality of transistors. A transistor can be implemented as a thin film transistor (TFT) of a metal-oxide-semiconductor FET (MOSFET) structure, and can be an oxide TFT including an oxide semiconductor or an LIPS TFT including low temperature polysilicon (LIPS). The oxide TFT can be implemented as an n-type TFT (NMOS), and the LIPS TFT can be implemented as a p-type TFT (PMOS). In each of the GIP circuit and the pixel circuit of the gate driving circuit, both the n-type TFT (NMOS) and the p-type TFT (PMOS) can be formed.

A MOSFET is a three-electrode device including a gate, a source, and a drain. The source is an electrode that supplies carriers to the transistor. In the MOSFET, carriers start flowing from the source. The drain is an electrode through which carriers exit the MOSFET. In the MOSFET, carriers flow from the source to the drain. In the case of the n-type TFT (NMOS), since carriers are electrons, a source voltage is lower than a drain voltage so that electrons can flow from the source to the drain. In the n-type TFT (NMOS), current flows in a direction from the drain to the source. In the case of the p-type TFT (PMOS), since carriers are holes, a source voltage is higher than a drain voltage so that holes can flow from the source to the drain. In the p-type TFT (PMOS), since holes flow from the source to the drain, current flows from the source to the drain. It should be noted that the source and drain of the TFT are not fixed. For example, the source and drain can be changed according to an applied voltage. Therefore, the invention is not limited by the source and drain of the TFT. In the following description, the source and the drain of the TFT will be referred to as first and second electrodes, respectively.

A gate signal output from a GIP circuit of the gate driving circuit swings between a gate-on voltage and a gate-off voltage. The gate-on voltage is set to a voltage higher than a threshold voltage of the TFT, and the gate-off voltage is set to a voltage lower than the threshold voltage of the TFT. The TFT is turned on in response to the gate-on voltage, while turned-off in response to the gate-off voltage.

Hereinafter, various embodiments of the present specification will be described in detail with reference to the accompanying drawings.

In the following embodiments, an electroluminescent display will be mainly described with respect to an organic light-emitting diode display including an organic light-emitting material. It should be noted that the technical concept of the present specification is not limited to the organic light-emitting diode display. For example, the present invention is applicable to a gate driving circuit of a digital flat panel display that requires a gate driving circuit, for example, a liquid crystal display (LCD) or a quantum dot display (QD) without significant change. Further, all components of each display device according to all embodiments of the present invention are operatively coupled and configured.

FIG. 1 is a block diagram illustrating a display device according to an embodiment of the present invention.

Referring to FIG. 1, the display device according to the embodiment of the present specification includes a display panel 100 and a display panel driving circuit.

The display panel 100 includes an active area AA that displays data of an input image. The active area AA is a screen on which video data of an input image is displayed. A pixel array of the active area AA includes a plurality of data lines DL, a plurality of gate lines GL intersecting the data lines DL, and pixels arranged in a matrix. In addition to the matrix, the pixels can be arranged in various forms, such as a form in which pixels emitting the same color are shared, a stripe form, and a diamond form.

Each of the pixels can be divided into a red subpixel, a green subpixel, and a blue subpixel to implement color. Each of the pixels can further include a white subpixel. Each of the subpixels 101 includes a pixel circuit. The pixel circuit includes a light-emitting element, a plurality of TFTs, and a capacitor in the case of an electroluminescent display. The pixel circuit is connected to a data line DL and a gate line GL. In FIG. 1, "D1 to D3" indicated in a circle are data lines, and "Gn−2 to Gn" indicated in the circle are gate lines, where n can be a positive integer.

Touch sensors can be disposed on the display panel 100. Touch input can be sensed using separate touch sensors or can be sensed through pixels. The touch sensors can be disposed on a screen of the display panel as on-cell type or add-on type touch sensors or can be implemented as in-cell type touch sensors embedded in the pixel array.

A driving circuit for driving the display panel 100 includes a data driving circuit 110 and a gate driving circuit 120. The display panel driving circuit writes data of an input image to pixels of the display panel 100 under control of a timing controller (TCON) 130.

The data driving circuit 110 converts digital data V-DATA, which is pixel data of an input image received from the timing controller 130 at each frame, into a gamma compensation voltage, and outputs a data signal. The data driving circuit 110 supplies a voltage of the data signal (hereinafter, a "data voltage") to the data lines DL. The data driving circuit 110 outputs a data voltage using a digital-to-analog converter (hereinafter referred to as "DAC") that converts digital data VDATA into a gamma compensation voltage.

The gate driving circuit 120 can be formed in a bezel area BZ in which an image is not displayed on the display panel 100. The gate driving circuit 120 outputs a gate signal under control of the timing controller 130 to select pixels charged with a data voltage through the gate lines GL. The gate driving circuit 120 outputs a gate signal using one or more shift registers and shifts the gate signal. The gate driving circuit 120 shifts the gate signal supplied to the gate lines at certain shift timing up to a predetermined specific gate line within a vertical active period, and then temporarily holds a voltage of the specific gate line in response to a line control signal. Subsequently, the gate driving circuit 120 supplies a gate signal (scan pulse signal) to the specific gate line, and then shifts the gate signal (scan pulse signal) supplied to the remaining gate lines at a certain shift timing. Accordingly, within the vertical active period, first and second gate signals are applied only to the specific gate line with a predetermined holding time interposed therebetween, and one gate signal is applied to each of the other gate lines.

The timing controller 130 receives pixel data of an input image and a timing signal synchronized with the pixel data from a host system. The pixel data of the input image received by the timing controller 130 is digital data. The timing signal includes a vertical synchronization signal Vsync, a horizontal synchronization signal Hsync, a clock signal DCLK, a data enable signal DE, etc. Since a vertical period and a horizontal period can be known by counting the data enable signal DE, the vertical synchronization signal Vsync and the horizontal synchronization signal Hsync can be omitted.

The host system can be any one of a television (TV), a set-top box, a navigation system, a personal computer (PC), a home theater, a mobile device, and a wearable device. In the mobile device and the wearable device, the data driving unit 110, the timing controller 130, a level shifter 140, etc. can be integrated into one drive IC.

The timing controller 130 can multiply an input frame frequency by i to control the operation timing of the data driving circuit 110 and the gate driving circuit 120 with a frame frequency of input frame frequency×i (i being a positive integer greater than 0) Hz. The input frame frequency is 60 Hz in a national television standards committee (NTSC) scheme and 50 Hz in a phase-alternating line (PAL) scheme.

The timing controller 130 can lower the driving frequency of the data driving circuit 110 and the gate driving circuit 120 in a low-speed driving mode. For example, the timing controller 130 can lower the driving frequency of the display panel driving circuit to a level of 1 Hz so that data is written to the pixels once per second. The frequency of the low-speed driving mode is not limited to 1 Hz. Accordingly, the pixels of the display panel 100 can maintain a data voltage, with which the pixels are previously charged, without being charged with a new data voltage for most of the time in the low-speed driving mode.

The timing controller 130 generates a data timing control signal DDC for controlling the operation timing of the data driving circuit 110 and a gate timing control signal GDC for controlling the operation timing of the gate driving circuit 120 based on a timing signal received from the host system.

The level shifter 140 converts a high-level voltage of the gate timing control signal GDC output from the timing controller 130 into a gate-on voltage, converts a low-level voltage of the gate timing control signal GDC into a gate-off voltage, and supplies the voltages to the gate driving circuit 120. In the case of an n-channel TFT (NMOS), the gate-on voltage can be a gate-high voltage VGH, and the gate-off voltage can be a gate-low voltage VGL. In the case of a p-channel TFT (PMOS), the gate-on voltage can be a gate-low voltage VGL, and the gate-off voltage can be a gate-high voltage VGH. Hereinafter, a high-potential power voltage Vdd can be interpreted as a gate-on voltage. A low-potential power voltage Vss can be set to a voltage lower than the high-potential power voltage Vdd. The low-potential power voltage Vss can be interpreted as a gate-off voltage.

The gate timing control signal GDC includes a gate start pulse VST, a line select pulse LSP, a carry clock signal CRCLK, a scan clock signal SCCLK, etc. The start pulse VST is generated once at the beginning of a frame period in every frame period and is input to the gate driving circuit 120.

The start pulse VST controls the start timing of the gate driving circuit 120 in every frame period. The carry clock signal CRCLK and the scan clock signal SCCLK control shift timing of a carry pulse and a scan pulse output from the gate driving circuit 120.

Figure 2:
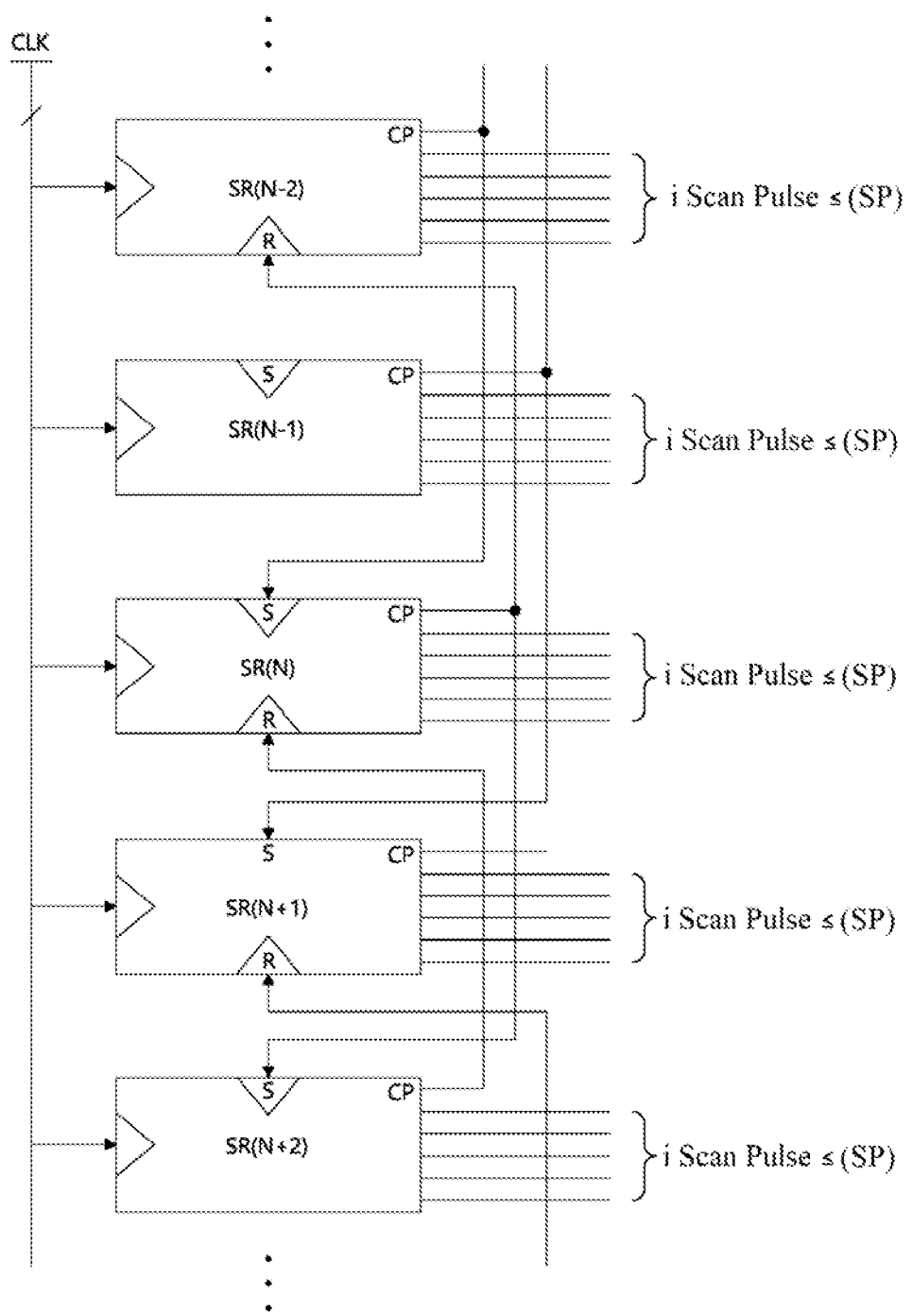
FIG. 2 is a schematic configuration diagram of a shift register of a gate driving circuit 120.

FIG. 2 is a diagram schematically illustrating a shift register of the gate driving circuit 120.

Referring to FIG. 2, first, the gate driving circuit 120 can be driven by three carry clocks and 12 scan clocks.

Each carry clock and each scan clock maintain a high level for two horizontal periods (2H).

In addition, the 12 scan clocks are shifted by high levels thereof overlapping with neighboring scan clocks for one horizontal period.

As illustrated in FIG. 2, the shift register of the gate driving circuit 120 includes stages SR(N−2) to SR(N+2) that are subordinately connected through wires. The shift register receives a start pulse VST, or a carry pulse CP from a previous stage and a carry pulse CP from a subsequent stage, and outputs one carry pulse CP and i scan pulses SP according to input clock timing CLK. Here, N and i are natural numbers, preferably natural numbers greater than or equal to 2.

The carry pulse CP output from the previous stage can be a set signal, and the carry pulse CP output from the subsequent stage can be a reset signal.

FIG. 2 illustrates that an Nth stage SR(N) is set by a carry pulse CP output from a (N−2)th stage SR(N−2) and is reset by a carry pulse CP output from a (N+2)th stage SR(N+2). However, the present invention is not limited thereto, and various modifications can be made according to the number of clocks and a phase between respective clocks.

Figure 3:
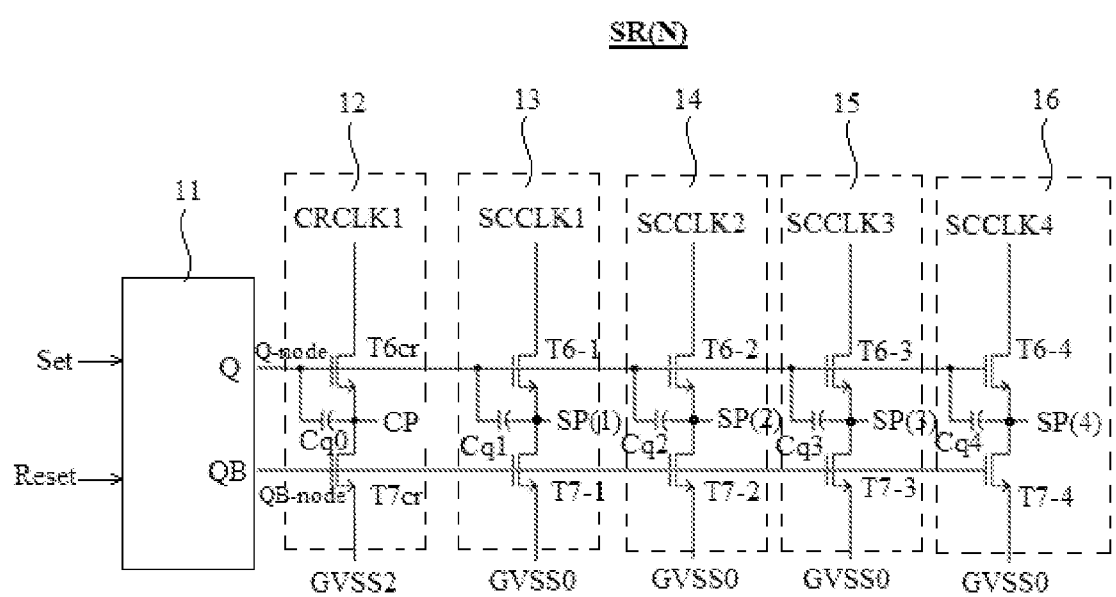
FIG. 3 is a detailed circuit diagram of an Nth stage according to a comparative example of the present invention.

FIG. 3 is a detailed circuit diagram of an Nth stage SR(N) according to a comparative example of the present invention.

In FIG. 3, a set signal Set can be a start pulse VST, a carry pulse CP output from a previous stage, or a set signal input from the outside, and a reset signal Reset can be a carry pulse CP output from a subsequent stage or a reset signal input from the outside.

In addition, the set signal Set and the reset signal Reset can use a carry clock signal CRCLK or a scan clock signal SCCLK.

A configuration of the Nth stage according to the comparative example will be described as follows.

As illustrated in FIG. 3, the Nth stage includes a node controller 11 that controls voltages of a first node Q-node and a second node QB-node according to the set signal Set and the reset signal Reset described above, a carry pulse output unit 12 that outputs a first carry clock CRCLK1 as a carry pulse CP according to voltages of the first node Q-node and the second node QB-node, a first scan pulse output unit 13 that outputs a first scan clock SCCLK1 as a first scan pulse SP(1) according to voltages of the first node Q-node and the second node QB-node, a second scan pulse output unit 14 that outputs a second scan clock SCCLK2 as a second scan pulse SP(2) according to voltages of the first node Q-node and the second node QB-node, a third scan pulse output unit 15 that outputs a third scan clock SCCLK3 as a third scan pulse SP(3) according to voltages of the first node Q-node and the second node QB-node, and a fourth scan pulse output unit 16 that outputs a fourth scan clock SCCLK4 as a fourth scan pulse SP(4) according to voltages of the first node Q-node and the second node QB-node.

The node controller 11 performs a control operation so that a voltage phase of the first node Q-node and a voltage phase of the second node QB-node become opposite to each other and performs a control operation so that a high level section of a voltage of the first node Q-node is shorter than a high level section of a voltage of the second node QB-node.

Each of the carry pulse output unit 12 and the first to fourth scan pulse output units 13 to 16 has the same configuration.

For example, each of the carry pulse output unit 12 and the first to fourth scan pulse output units 13 to 16 includes a pull-up transistor T6cr, T6-1, T6-2, T6-3, or T6-4 turned on or turned off according to the voltage of the first node Q-node to output a carry clock or a corresponding scan clock to an output terminal, a pull-down transistor T7cr, T7-1, T7-2, T7-3, or T7-4 turned on or turned off according to the voltage of the second node QB-node to output low-voltage power GVSS to an output terminal, and a capacitor Cq0, Cq1, Cq2, Cq3, or Cq4 connected between the first node Q-node and the output terminal to bootstrap a gate voltage of each pull-up transistor.

An operation of a gate driving circuit according to the comparative example of the present invention configured in this way will be described as follows.

Figure 4:
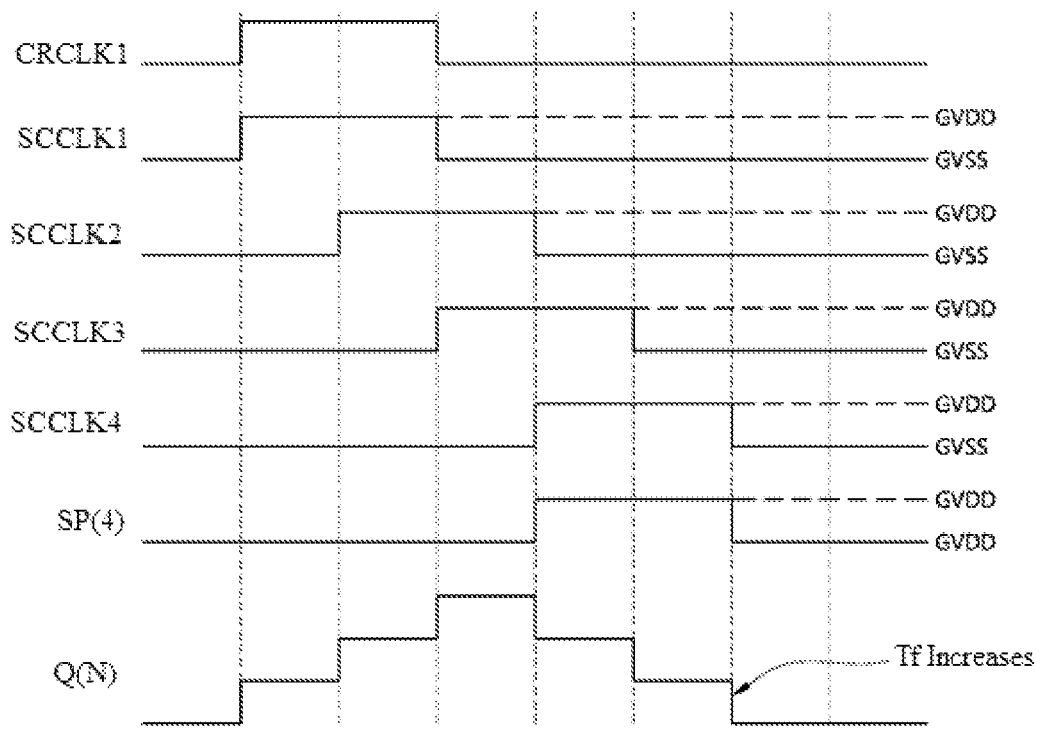
FIG. 4 is an input/output waveform diagram of a gate driving circuit according to the comparative example of the present invention.

FIG. 4 is a diagram illustrating an input/output waveform of the gate driving circuit according to the comparative example of the present invention.

As illustrated in FIG. 4, when a start signal VST or a carry pulse CP output from the previous two stages is input at a high level, the node controller 11 applies a high-level voltage GVDD to the first node Q-node and a low-level voltage GVSS2 to the second node QB-node.

In this state, the pull-up transistor T6cr of the carry pulse output unit 12 is turned on, and the pull-down transistor T7cr is turned off. Thus, the first carry clock CRCLK1 is output as a carry pulse CP.

When the first scan clock SCCLK1 is input at a high level, the first node Q-node is bootstrapped by a first capacitor Cq1 of the first scan pulse output unit 13, the pull-up transistor T6-1 of the first scan pulse output unit 13 is turned on, and the pull-down transistor T7-1 is turned off. Thus, the first scan clock SCCLK1 is output as the first scan pulse SP(1).

When the second scan clock SCCLK2 is input at a high level, the first node Q-node is bootstrapped by the second capacitor Cq2 of the second scan pulse output unit 14, the pull-up transistor T6-2 of the second scan pulse output unit 14 is turned on, and the pull-down transistor T7-2 is turned off. Thus, the second scan clock SCCLK2 is output as the second scan pulse SP(2).

When the third scan clock SCCLK3 is input at a high level, the first node Q-node is bootstrapped by the third capacitor Cq3 of the third scan pulse output unit 15, the pull-up transistor T6-3 of the third scan pulse output unit 15 is turned on, and the pull-down transistor T7-3 is turned off. Thus, the third scan clock SCCLK3 is output as the third scan pulse SP(3).

When the fourth scan clock SCCLK4 is input at a high level, the first node Q-node is bootstrapped by the fourth capacitor Cq4 of the fourth scan pulse output unit 16, the pull-up transistor T6-4 of the fourth scan pulse output unit 16 is turned on, and the pull-down transistor T7-4 is turned off. Thus, the fourth scan clock SCCLK4 is output as the fourth scan pulse SP(4).

However, since the second scan clock SCCLK2 transitions to a low level when the fourth scan clock SCCLK4 transitions to a high level, the voltage of the first node Q-node when the fourth scan clock SCCLK4 is input at a high level becomes lower than a bootstrapped voltage when the third scan clock SCCLK3 is input at a high level.

Further, when the third scan clock SCCLK3 changes to a low level, the voltage of the first node Q-node becomes lower, and when the fourth scan clock SCCLK4 changes to a low level, the voltage of the first node Q-node is lowered once again.

For this reason, a falling time of the fourth scan pulse SP(4) output from the fourth scan pulse output unit 16 is increased. As a result, since the falling time of the scan pulse is increased in every last scan pulse output unit of each stage, driving of the display device can become unstable.

Accordingly, there is a need to improve characteristics of the last scan pulse output unit of each stage.

Although FIG. 4 illustrates that the first carry clock CRCLK1 is synchronized with the first scan clock SCCLk1, the present invention is not limited thereto. For example, since the Nth stage is set by a carry pulse CP output from an (N−2)th stage, and a carry pulse output from the Nth stage sets an (N+2)th stage and resets the (N−2)th stage, the first carry clock CRCLK1 can vary among the first to fourth scan clocks SCCLk1 to SCCLk4 according to circumstances.

Figure 5:
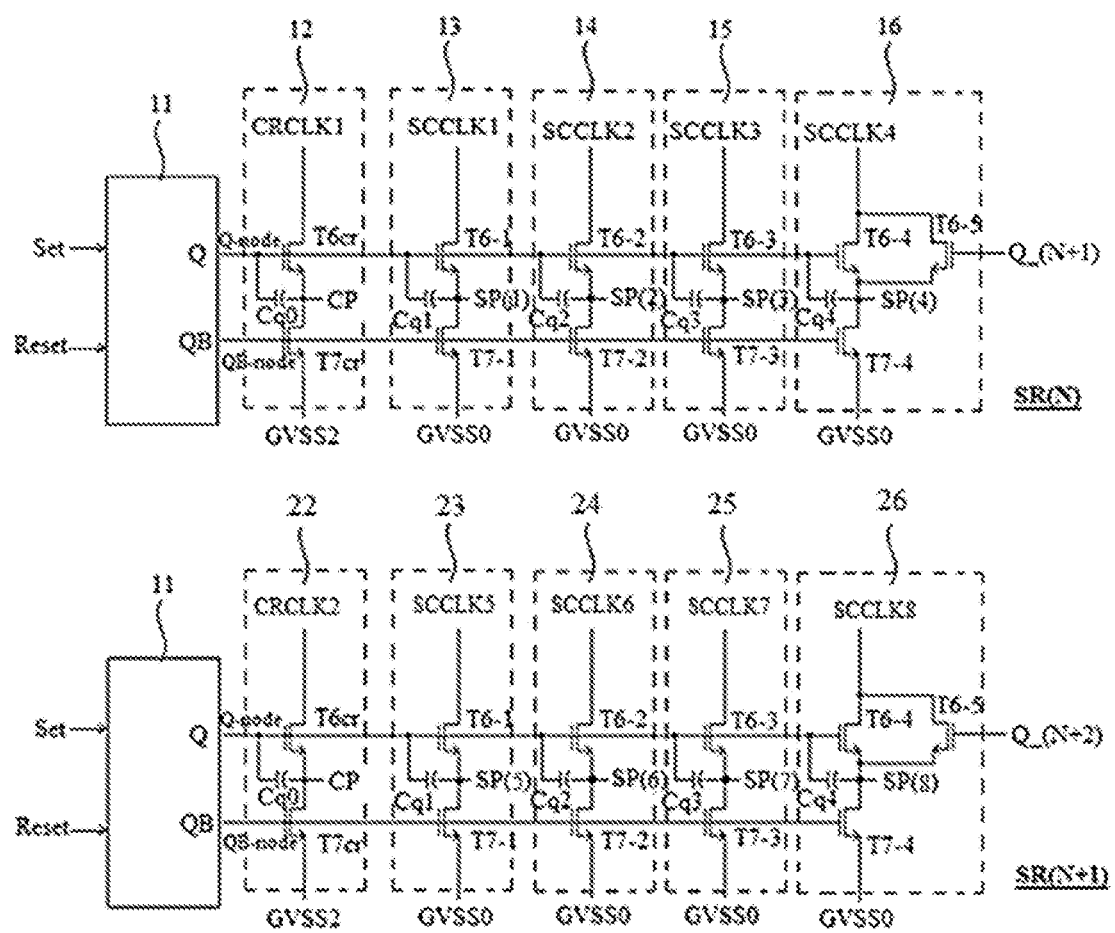
FIG. 5 is detailed circuit diagrams of Nth and (N+1)th stages according to an embodiment of the present invention.

FIG. 5 is detailed circuit diagrams of the Nth stage SR(N) and the (N+1)th stage SR(N+1) according to an embodiment of the present invention.

In FIG. 5, a set signal Set can be a start pulse VST, a carry pulse CP output from a previous stage, or a set signal input from the outside, and a reset signal Reset can be a carry pulse CP output from a subsequent stage or a reset signal input from the outside.

In addition, the set signal Set and the reset signal Reset can use a carry clock signal CRCLK or a scan clock signal SCCLK.

For example, the node controller 11 of the Nth stage can be set by a carry pulse CP(N−2) output from the (N−2)th stages, and can be reset by a carry pulse CP(N+2) output from the (N+2)th stages.

As described above, since the gate driving circuit is driven by three carry clocks and 12 scan clocks, when one carry pulse output unit and four scan pulse output units are provided in one stage, one stage is driven by one carry clock and four scan clocks.

The Nth stage and the (N+1)th stage have the same configuration. However, for the same reason as described above, a carry clock and scan clocks supplied to the Nth stage and a carry clock and scan clocks supplied to the (N+1)th stage are different from each other.

Therefore, the Nth stage includes a node controller 11 that controls voltages of a first node Q-node and a second node QB-node according to the set signal Set and the reset signal Reset described above, a first carry pulse output unit 12 that outputs a first carry clock CRCLK1 as a carry pulse CP according to voltages of the first node Q-node and the second node QB-node, a first scan pulse output unit 13 that outputs a first scan clock SCCLK1 as a first scan pulse SP(1) according to voltages of the first node Q-node and the second node QB-node, a second scan pulse output unit 14 that outputs a second scan clock SCCLK2 as a second scan pulse SP(2) according to voltages of the first node Q-node and the second node QB-node, a third scan pulse output unit 15 that outputs a third scan clock SCCLK3 as a third scan pulse SP(3) according to voltages of the first node Q-node and the second node QB-node, and a fourth scan pulse output unit 16 that outputs a fourth scan clock SCCLK4 as the fourth scan pulse SP(4) according to voltages of the first node Q-node and the second node QB-node and a voltage of a first node Q-node of the (N+1)th stage.

The (N+1)th stage includes a node controller 11 that controls voltages of a first node Q-node and a second node QB-node according to the set signal Set and the reset signal Reset, a second carry pulse output unit 22 that outputs a second carry clock CRCLK2 as a carry pulse CP according to voltages of the first node Q-node and the second node QB-node, a fifth scan pulse output unit 23 that outputs a fifth scan clock SCCLK5 as a fifth scan pulse SP(5) according to voltages of the first node Q-node and the second node QB-node, a sixth scan pulse output unit 24 that outputs a sixth scan clock SCCLK6 as a sixth scan pulse SP(6) according to voltages of the first node Q-node and the second node QB-node, a seventh scan pulse output unit 25 that outputs a seventh scan clock SCCLK7 as a seventh scan pulse SP(7) according to voltages of the first node Q-node and the second node QB-node, and an eighth scan pulse output unit 26 that outputs an eighth scan clock SCCLK8 as an eighth scan pulse SP(8) according to voltages of the first node Q-node and the second node QB-node and a voltage of the first node Q-node of the (N+1)th stage.

The node controller 11 performs a control operation so that a voltage phase of the first node Q-node and a voltage phase of the second node QB-node become opposite to each other and performs a control operation so that a high level section of a voltage of the first node Q-node is shorter than a high level section of a voltage of the second node QB-node.

Each of the first and second carry pulse output units 12 and 22 and the first to third and fifth to seventh scan pulse output units 13 to 15 and 23 to 25 has the same configuration as that described in the comparative example.

For example, each of the first and second carry pulse output units 12 and 22 and the first to third and fifth to seventh scan pulse output units 13 to 15 and 23 to 25 includes a pull-up transistor T6cr, T6-1, T6-2, or T6-3 turned on or turned off according to the voltage of the first node Q-node to output a carry clock or a corresponding scan clock to an output terminal, a pull-down transistor T7cr, T7-1, T7-2, or T7-3 turned on or turned off according to the voltage of the second node QB-node to output low-voltage power GVSS to an output terminal, and a capacitor Cq0, Cq1, Cq2, or Cq3 connected between the first node Q-node and the output terminal to bootstrap a gate voltage of each pull-up transistor.

Meanwhile, the fourth and eighth scan pulse output units 16 and 26 are configured differently from the first to third and fifth to seventh scan pulse output units 13 to 15 and 23 to 25.

For example, the fourth scan pulse output unit 16 includes a first pull-up transistor T6-4 turned on or turned off according to a voltage of the first node Q-node to output the corresponding scan clock SCCLK4 to an output terminal, a second pull-up transistor T6-5 turned on or turned off according to a voltage of a first node Q (N+1) of a subsequent stage to output the corresponding scan clock SCCLK4 to an output terminal, a pull-down transistor T7-4 turned on or turned off according to a voltage of the second node QB-node to output low-voltage power GVSS to an output terminal, and a capacitor Cq4 connected between the first node Q-node and the output terminal to bootstrap a gate voltage of the first pull-up transistor T6-4.

The eighth scan pulse output unit 26 includes a first pull-up transistor T6-4 turned on or turned off according to a voltage of the first node Q-node to output the corresponding scan clock SCCLK8 to an output terminal, a second pull-up transistor T6-5 turned on or turned off according to a voltage of a first node Q (N+2) of a subsequent stage to output the corresponding scan clock SCCLK8 to an output terminal, a pull-down transistor T7-4 turned on or turned off according to a voltage of the second node QB-node to output low-voltage power GVSS to an output terminal, and a capacitor Cq4 connected between the first node Q-node and the output terminal to bootstrap a gate voltage of the first pull-up transistor T6-4.

An operation of a gate driving circuit according to an embodiment of the present invention configured as described above will be described below.

Figure 6:
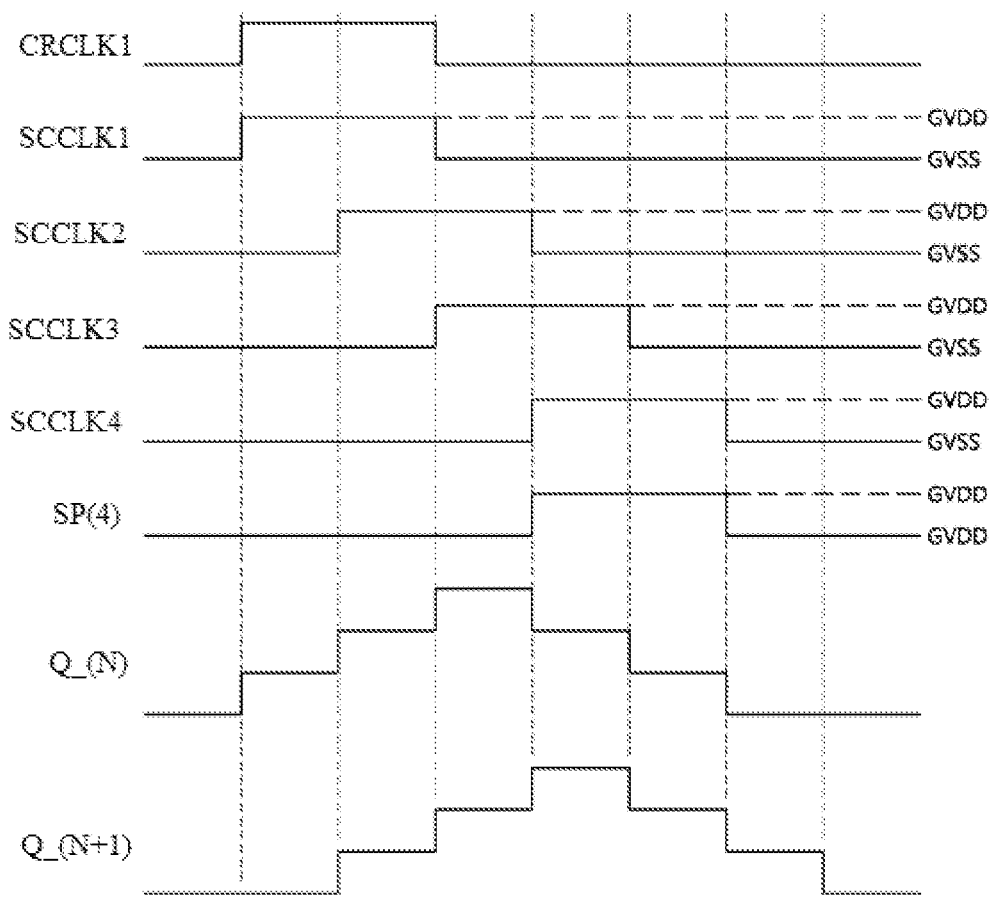
FIG. 6 is an input/output waveform diagram of a gate driving circuit according to an embodiment of the present invention.

FIG. 6 is an input/output waveform diagram of the gate driving circuit according to the embodiment of the present invention.

As illustrated in FIG. 6, in the Nth stage, when a start signal VST or a carry pulse CP output from a (N−2)th stage is input at a high level, the node controller 11 applies a high-level voltage GVDD to a first node Q-node and applies a low-level voltage GVSS2 to a second node QB-node.

In this state, the pull-up transistor T6cr of the carry pulse output unit 12 is turned on, and the pull-down transistor T7cr is turned off, thereby outputting a carry clock CRCLK as a carry pulse CP.

When the first scan clock SCCLK1 is input at a high level, the first node Q-node is bootstrapped by the first capacitor Cq1 of the first scan pulse output unit 13, the pull-up transistor T6-1 of the first scan pulse output unit 13 is turned on, and the pull-down transistor T7-1 is turned off, thereby outputting the first scan clock SCCLK1 as the first scan pulse SP(1).

When the second scan clock SCCLK2 is input at a high level, the first node Q-node is bootstrapped by the second capacitor Cq2 of the second scan pulse output unit 14, the pull-up transistor T6-2 of the second scan pulse output unit 14 is turned on, and the pull-down transistor T7-2 is turned off, thereby outputting the second scan clock SCCLK2 as the second scan pulse SP(2).

When the third scan clock SCCLK3 is input at a high level, the first node Q-node is bootstrapped by the third capacitor Cq3 of the third scan pulse output unit 15, the pull-up transistor T6-3 of the third scan pulse output unit 15 is turned on, and the pull-down transistor T7-3 is turned off, thereby outputting the third scan clock SCCLK3 as the third scan pulse SP(3).

When the fourth scan clock SCCLK4 is input at a high level, the first node Q-node is bootstrapped by the fourth capacitor Cq4 of the fourth scan pulse output unit 16, the pull-up transistor T6-4 of the fourth scan pulse output unit 16 is turned on, and the pull-down transistor T7-4 is turned off, thereby outputting the fourth scan clock SCCLK4 as the fourth scan pulse SP(4).

However, since the second scan clock SCCLK2 transitions to a low level when the fourth scan clock SCCLK4 transitions to a high level, the voltage of the first node Q-node when the fourth scan clock SCCLK4 is input at a high level becomes lower than a bootstrapped voltage when the third scan clock SCCLK3 is input at a high level.

Further, when the third scan clock SCCLK3 changes to a low level, the voltage of the first node Q-node becomes lower, and when the fourth scan clock SCCLK4 changes to a low level, the voltage of the first node Q-node is lowered once again.

For this reason, a falling time of the fourth scan pulse SP(4) output from the fourth scan pulse output unit 16 can be increased.

However, the second pull-up transistor T6-5 of the fourth scan pulse output unit 16 is turned on according to a voltage Q_(N+1) of the first node of the (N+1)th stage to output the fourth scan clock SCCLK4 as a fourth scan pulse SP(4).

As illustrated in FIG. 6, when the fourth scan clock SCCLK4 changes to a falling edge, since the voltage Q (N+1) of the first node of the (N+1)th stage is maintained at a higher level than that of a voltage Q N of the first node of the Nth stage SR(N), a falling time of the fourth scan pulse SP(4) is reduced.

Accordingly, the embodiments of the present invention can improve the output characteristics of the fourth scan pulse output unit 16.

Since an operation of the (N+1)th stage is different only in terms of the scan clocks supplied, and is performed as described in FIG. 6, a description of the operation of the (N+1)th stage is omitted or may be briefly discussed.

FIG. 6 illustrates that the first carry clock CRCLK1 is synchronized with the first scan clock SCCLK1. However, the present invention is not limited thereto. For example, since the Nth stage is set by the carry pulse CP output from the (N−2)th stage, and the carry pulse output from the Nth stage sets the (N+2)th stage and resets the (N−2)th stage, the first carry clock CRCLK1 can vary between the first to fourth scan clocks SCCLk1 to SCCLk4 according to circumstances.

Figure 7:
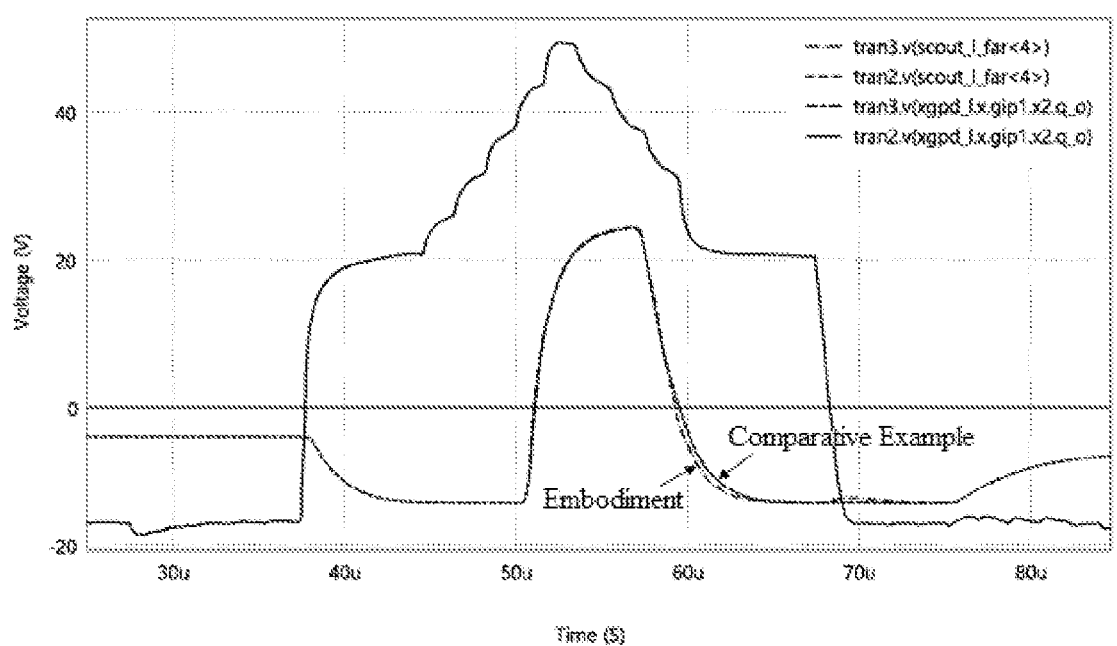
FIG. 7 is a graph comparing scan pulse outputs of a fourth scan pulse output unit 16 according to a comparative example and an embodiment of the present invention.

FIG. 7 is a graph comparing scan pulse outputs of the fourth scan pulse output unit 16 according to the comparative example and the embodiment of the present invention.

As illustrated in FIG. 7, the falling time of the fourth scan pulse SP(4) according to the embodiment of the present invention can be reduced more than the falling time of the fourth scan pulse SP(4) according to the comparative example.

The gate driving circuit and the display device using the same according to the present invention having the above characteristics have the following effects.

According to the embodiments of the present invention, since the last scan pulse output unit further outputs the corresponding scan clock as a scan pulse according to the voltage of the Q-node of the subsequent stage, the falling time of the scan pulse can be reduced, and the output characteristics of the scan pulse output unit can be improved.

Accordingly, the gate driving circuit can be stably driven, and display quality can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A gate driving circuit comprising a plurality of subordinately connected stages, wherein an Nth stage, N being a natural number, includes:
   a node controller configured to control voltages of a first node and a second node according to a set signal and a reset signal; and
   a plurality of scan pulse output units configured to receive a plurality of scan clocks, and output each of the scan clocks as a scan pulse according to the voltages of the first node and the second node, wherein a last scan pulse output unit among the plurality of scan pulse output units further outputs a corresponding scan clock as a scan pulse while receiving a first node voltage of an (N+1)th stage, wherein the last scan pulse output unit includes:
- a first pull-up transistor turned on or turned off according to a voltage of the first node to output a corresponding scan clock to an output terminal; and
- a second pull-up transistor turned on or turned off according to the first node voltage of the (N+1)th stage to output the corresponding scan clock to an output terminal, and wherein the first pull-up transistor and the second pull-up transistor are connected in parallel.

2. The gate driving circuit according to claim 1, further comprising a carry signal output unit configured to output a carry clock as a carry pulse according to the voltages of the first node and the second node.

3. The gate driving circuit according to claim 1, wherein the last scan pulse output unit further includes:
- a pull-down transistor turned on or turned off according to a voltage of the second node to output low-voltage power to an output terminal.

4. The gate driving circuit according to claim 1, wherein the last scan pulse output unit further includes a capacitor connected between a gate electrode of the first pull-up transistor and an output terminal to bootstrap the first node.

5. The gate driving circuit according to claim 1, wherein at least a portion of the scan pulse for the corresponding scan clock output by the last scan pulse output unit overlaps with a peak voltage level of the first node voltage of the (N+1)th stage.

6. The gate driving circuit according to claim 1, wherein each of the first node voltage of the Nth stage and the first node voltage of the (N+1)th stage increases in a stepwise manner and then decreases in a stepwise manner.

7. The gate driving circuit according to claim 6, wherein a peak voltage level of the first node voltage of the Nth stage occurs before a peak voltage level of the first node voltage of the (N+1)th stage.

8. The gate driving circuit according to claim 7, wherein the peak voltage level of the first node voltage of the (N+1)th stage corresponds to a rising edge of the scan pulse for the corresponding scan clock output by the last scan pulse output unit.

9. The gate driving circuit according to claim 6, wherein a falling edge of the scan pulse for the corresponding scan clock output by the last scan pulse output unit correspond to a falling edge of the first node voltage of the Nth stage.

10. The gate driving circuit according to claim 1, wherein a timing of a falling edge of the scan pulse for the corresponding scan clock output by the last scan pulse output unit depends on the first node voltage of the (N+1)th stage.

11. A display device comprising:
- a display panel including data lines, gate lines, and subpixels;
- a data driving circuit configured to supply a data signal of an input image to the data lines; and
- a gate driving circuit configured to supply a gate signal to the gate lines, wherein:

the gate driving circuit includes a plurality of subordinately connected stages, an Nth stage, N being a natural number, includes:
- a node controller configured to control voltages of a first node and a second node according to a set signal and a reset signal; and
- a plurality of scan pulse output units configured to receive a plurality of scan clocks, and output each of the scan clocks as a scan pulse according to voltages of the first node and the second node, wherein a last scan pulse output unit among the plurality of scan pulse output units further outputs a corresponding scan clock as a scan pulse while receiving a first node voltage of an (N+1)th stage, wherein the last scan pulse output unit includes:
- a first pull-up transistor configured to turn on or off based on a voltage of the first node to output a corresponding scan clock to an output terminal; and
- a second pull-up transistor configured to turn on or off based on the first node voltage of the (N+1)th stage to output the corresponding scan clock to an output terminal, and wherein the first pull-up transistor and the second pull-up transistor are connected in parallel.

12. The display device according to claim 11, further comprising a carry signal output unit configured to output a carry clock as a carry pulse based on the voltages of the first node and the second node.

13. The display device according to claim 11, wherein the last scan pulse output unit further includes:
- a pull-down transistor configured to turn on or off based on a voltage of the second node to output low-voltage power to an output terminal.

14. The display device according to claim 11, wherein the last scan pulse output unit further includes a capacitor connected between a gate electrode of the first pull-up transistor and an output terminal to bootstrap the first node.

15. The display device according to claim 11, wherein at least a portion of the scan pulse for the corresponding scan clock output by the last scan pulse output unit overlaps with a peak voltage level of the first node voltage of the (N+1)th stage.

16. The display device according to claim 11, wherein a timing of a falling edge of the scan pulse for the corresponding scan clock output by the last scan pulse output unit depends on the first node voltage of the (N+1)th stage.

* * * * *